United States Patent [19]

Lukens et al.

[11] Patent Number: 4,470,023
[45] Date of Patent: * Sep. 4, 1984

[54] COHERENT ARRAY OF JOSEPHSON OSCILLATORS WITH EXTERNAL BIAS LEADS

[75] Inventors: James E. Lukens; Aloke K. Jain, both of Stony Brook; Paul M. Mankiewich, East Setauket, all of N.Y.

[73] Assignee: The United States of America as represented by the Secretary of the Navy, Washington, D.C.

[*] Notice: The portion of the term of this patent subsequent to Aug. 29, 2001 has been disclaimed.

[21] Appl. No.: 258,705

[22] Filed: Apr. 29, 1981

[51] Int. Cl.³ .................... H03B 15/00; H01L 39/14
[52] U.S. Cl. ................................ 331/107 S; 331/50; 331/56; 307/306
[58] Field of Search ............... 331/50, 56, 107 S; 307/306

[56] References Cited

U.S. PATENT DOCUMENTS 4,249,094  2/1981  Fulton ........................... 331/107 S
4,344,052  8/1982  Davidson ....................... 307/306 X

OTHER PUBLICATIONS

Likharev, K. et al., "Mutual Phase Locking in Multijunction Josephson Arrays" IEEE Transactions On Magnetics, vol. MAG-17, No. 1, pp. 111-114, Jan. 1981.
Sandell, R. D., et al., "Flux Modulated Coherent Radiation from Arrays of Josephson Microbridges Coupled by Superconducting Loops", IEEE Trans. on Magnetics, vol. Mag 15, No. 1, Jan. 1979, pp. 462-464.
Jain, A. K., et al., "Observation of Phase Coherence Among Multiple Josephson Oscillators" Appl. Phys. Lett. 36(9), May 1, 1980, pp. 774-776.
Hansen, J. B., et al., "Coherent Arrays of Thin-Film Josephson Microbridges" IEEE Trans. on Magnetics, vol. Mag 17, No. 1, Jan. 1981, pp. 95-98.
Jain, A. K., et al., "Microwave Wideband Tunable Oscillators Using Coherent Arrays of Josephson Junctions" IEEE Trans. on Magnetics, vol. Mag 17, No. 1, Jan. 1981, pp. 99-102.

*Primary Examiner*—Siegfried H. Grimm
*Assistant Examiner*—W. R. Paxman
*Attorney, Agent, or Firm*—Robert F. Beers; Arthur A. McGill; Michael J. McGowan

[57] ABSTRACT

A coherent array of Josephson oscillators is provided. Individual hysteresis-free Josephson junctions are longitudinally arranged in a line and have such a spacing as to substantially eliminate quasiparticle interactions. To provide a common frequency of operation, equal and opposite dc voltages are produced in adjacent pairs of the Josephson junctions by an arrangement of interlocking dc SQUID's (Superconductive Quantum Interference Device) connected to transversely extending biasing leads. Phase coherence for the array is provided by a rf current circulating in an inductive feedback path that loops between the ends of the array.

7 Claims, 2 Drawing Figures

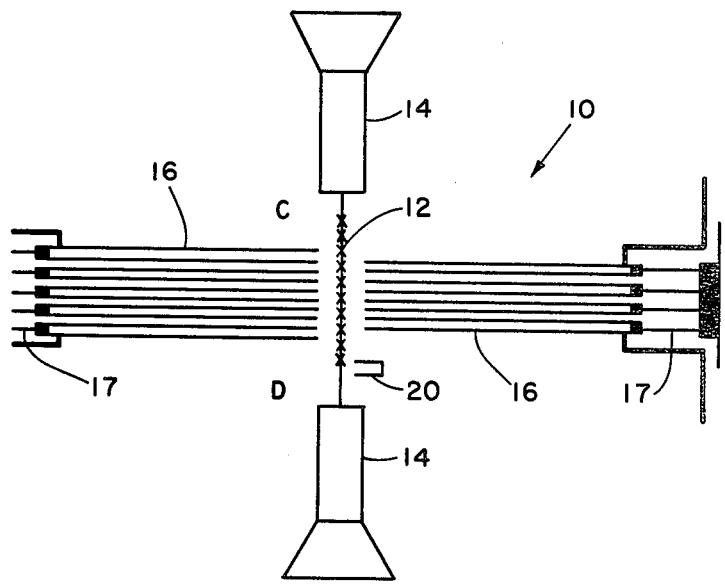
Fig. 1
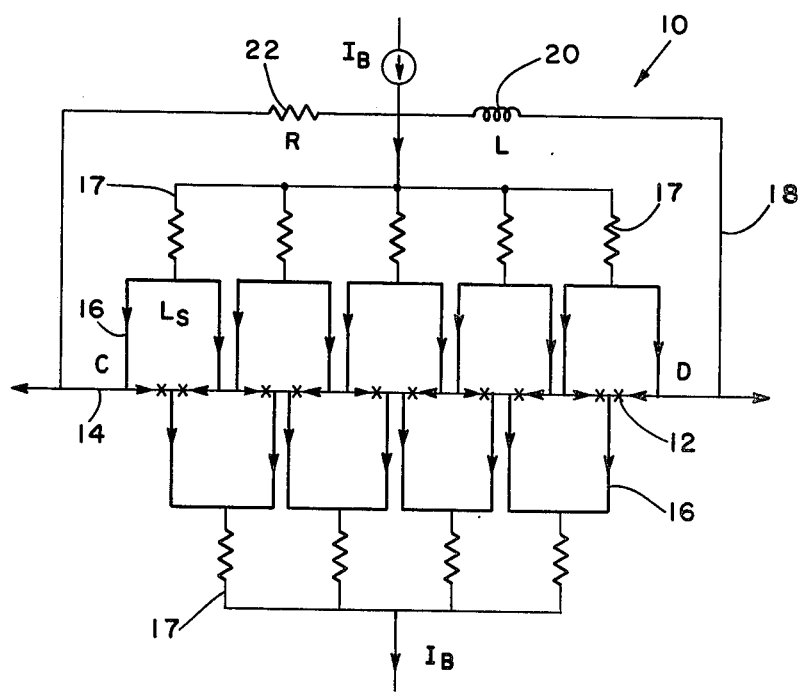
Fig. 2  {SHOWN ROTATED 90° RE FIG. 1}

COHERENT ARRAY OF JOSEPHSON OSCILLATORS WITH EXTERNAL BIAS LEADS

BACKGROUND OF THE INVENTION

This invention is drawn to the field of high frequency tunable oscillators, and more particularly, to a coherent array of Josephson oscillators.

The ac Josephson effect refers to the fact that when two superconductors are separated by a barrier, such as an insulating layer in a tunnel junction or a microbridge in a weak link, and a voltage (V) is established across the two superconductors, for example, by passing a biasing current therethrough, a periodic oscillating current of frequency f, which is associated with Cooper pairs passing through the junction, can be detected by the electromagnetic radiation of frequency f that it generates. The frequency (f) of this Josephson current is given by the relation $f = 2eV/h$; where e is the electron charge and h is Planck's constant.

The ac Josephson effect is also exhibited by exposing the junction to external radiation at another frequency, f'. In this case, it is found that a graph of dc current versus voltage for the junction has current steps at values of the voltage for Josephson frequencies that are integral multiples (n) of the external frequency (f') according to the relation $V = nhf'/2e$; whereby the junction can be said to lock to the external radiation by a process similar to injection locking.

By combining Josephson oscillators into an array in such a manner that the microwave radiation from each adds coherently, the low power levels and broad linewidths that characterize single Josephson oscillators are overcome. Possible applications for such coherent multijunction arrays include direct use as microwave and millimeter wave generators and detectors, parametric amplifiers, voltage standards and other uses.

One technique that can be used to provide coherent coupling in a multijunction array, reported in an article entitled: "Generation of Coherent Tunable Josephson Radiation at Microwave Frequencies with Narrowed Linewidths", by Varmazis et al, some of the authors of which are the present applicants, appearing at pp. 357-359, Appl. Phys. Lett. 33(4) (1978), incorporated herein by reference, comprises a resistive shunt around a series connected array of two (2) junctions. Although this technique demonstrates that the junctions lock to a common voltage and phase, the variation in characteristics between actual junctions makes it difficult to operate larger arrays at the same frequency without individual current biases.

An approach that can be used to overcome the problem of non-identical junctions, reported in an article entitled: "Flux Modulated Coherent Radiation from Arrays of Josephson Microbridges Coupled by Superconducting Loops" by Sandell et al, some of the authors of which are the present applicants, appearing at pp. 462-464, IEEE Trans. Magnetics, Vol. Mag. 15, No. 1, (1979), incorporated herein by reference, comprises a multijunction array of Josephson oscillators in an arrangement of interlocking dc SQUID's (Superconductive Quantum Interference Device), which assures that the average frequency of each of the array junctions is always equal even for non-identical junctions. Phase coherence between adjacent junctions is obtained by controllably varying an externally applied magnetic flux. Because of the condition of flux quantization in the individual SQUID loops, however, the induced Josephson oscillations add in random phase. That is, it has been found that the dc SQUID configuration controlled by the externally applied flux provides multijunction arrays with frequency synchronization but not with phase coherence.

SUMMARY OF THE INVENTION

The present invention overcomes the disadvantages of the above discussed techniques by providing a line array of Josephson junctions selectively spaced along an axis; a plurality of interlocking superconducting loops, having transversely extending biasing leads connected to a source of biasing current, shunted across adjacent pairs of the Josephson junctions to produce equal and opposite dc voltages across adjacent Josephson junctions to provide a common frequency of operation; and an inductive feedback loop connected between the ends of the array to produce a circulating rf current through the Josephson junctions to provide phase coherence.

According to one feature of the present invention, the Josephson junctions are hysteresis-free and preferably are thin film planar In microbridges 1500 Å thick by about 3000 Å square, spaced 10 microns apart to avoid intrinsic quasiparticle interactions. The microbridges are formed by well known electron beam lithography on a 25 mil sapphire substrate. The super-conducting loops are also of In.

According to another feature of the present invention, the feedback loop is preferably made of PbIn, and an insulating layer of SiO is disposed between and abutting the feedback loop and the array. The feedback loop is directly connected to one end of the array and connected at the other end through a lumped inductor. The inductance is selected so that the impedance of the feedback loop is approximately equal to the sum of the normal resistances of the In microbridges at the lowest frequency of interest. A resistor having a relatively small resistance is included in the feedback loop to prevent the biasing current from shorting out.

Accordingly, it is a primary object of the present invention to provide a coherent array of Josephson oscillators.

A related object of the present invention is to provide such an array by utilizing the non-linear properties of hysteresis-free Josephson oscillators.

Another related object is to synchronize the frequency of the Josephson oscillators in a manner that does not depend on the differences between the characteristics of the individual junctions.

Yet another related object is to phase lock the Josephson oscillators in a manner that does not require an externally applied magnetic flux.

These and other objects and novel features of the present invention will become apparent by reference to the appended claims and the following detailed description of the invention, when considered in conjunction with the drawings, wherein like parts are similarly designated throughout, and wherein:

BRIEF DESCRIPTION OF THE DRAWINGS

FIG. 1 is a top elevational view of the novel coherent multijunction array of the present invention; and FIG. 2 is a schematic diagram of the novel coherent multijunction array of the present invention.

DETAILED DESCRIPTION OF THE PREFERRED EMBODIMENT

Referring now to FIGS. 1 and 2, generally designated at 10 is a novel coherent multijunction array according to the present invention. Array 10 comprises a serial array of hysteresis-free Josephson junctions 12, designated by "X's", which are preferably formed on a sapphire substrate, not shown, as $0.1\Omega$ thin film planar In microbridges, 1500 Å thick by about 3000 Å square, spaced 10 microns apart to avoid intrinsic quasiparticle interactions. Junctions 12 are longitudinally connected in the gap of a central conductor 14, which preferably is a $50\Omega$ planar thin film gold-chrome microstrip transmission line having a ground plane, not shown.

To bias the junctions 12, a plurality of interlocking superconducting loops 16 of inductance $L_s$, shown as heavy lines, are shunted around adjacent pairs of the hysteresis-free Josephson junctions 12, and have transversely extending biasing leads 17 connected to a source of biasing current $I_B$. It will be appreciated that this biasing arrangement is essentially a series of interlocked dc SQUID's topologically equivalent to parallel dc biasing. As shown by the arrows in FIG. 2, equal and opposite dc voltages are produced in adjacent junctions by the biasing current $I_B$, thereby guaranteeing that all of the junctions 12 oscillate at the same average frequency, as discussed in the background of the invention.

The superconducting loops 16 preferably are made of planar thin film In, where $L_s$ is about 0.5 nH. The impedance (resulting from loop inductance $L_s$) of the superconducting loops preferably is comparatively larger than the junction normal resistance $(R_J)$ so as not to short out the Josephson oscillations of the junctions. It is to be noted in this connection that the mutual inductances of neighboring SQUID loops should be kept small, since a large mutual inductance leads to a small effective impedance around the whole array when the junctions are coherent.

In order to provide phase coherence between the junctions 12, a feedback loop 18 having a series arrangement of a lumped inductor (L) 20 and a resistor (R) 22 is shunted between the end points C and D of the junctions of the array. This loop preferably is made of a thin planar PbIn film insulated from the array by a SiO film, not shown. The inductance 20 is selected so that the inductive impedance of the loop 18 is about equal to the sum of the junction resistances $(R_J)$ at the lowest frequency of interest, i.e., $\omega_L = NR_J$, where N is the number of junctions. The resistor 22 included in the feedback loop 18 is selected to prevent shorting out of the biasing current.

It will be appreciated that the array 10 of the present invention is inserted in liquid helium, for example, to establish the superconducting state.

In operation, the Josephson oscillations produced in the junctions 12 by the above described biasing arrangement produce a circulating current $I_{rf}\sin\omega t$ in the feedback loop 18, which provides a common phase reference for the junctions. It has been found that the power output of the array scales as $N^2$ and the linewidth of the radiation scales as $1/N$ which evidences coherence of the novel multijunction array of Josephson oscillators of the present invention.

In order to appreciate how this is accomplished, consider the analogous phenomena of the phase locking of a Josephson oscillator to an external rf source as discussed in the background of the invention.

For a single resistively shunted junction (RSJ) biased on the first step due to an external rf current $I_{rf}\sin\omega t$, the phase difference $(\delta)$ between the synchronized supercurrent oscillations and the external rf is related to the change $(\Delta I_s)$ in the average (dc) supercurrent by the relation $$\Delta I_s = -J \cos \delta, \qquad (1)$$

where 2J is the height of the constant voltage step.

To understand the working of the array 10 according to the present invention, consider the action of this external rf current on a dc SQUID, the basic building block of the array, biased on the radiation induced step. For a large inductance $(L_s)$ of the SQUID loops, most of the rf current will flow through the junctions. For $I_{rf} << \phi_o/L_s$, the relative phases of oscillation of the two junctions of the dc SQUID are determined by the flux quantization condition, and the rf voltage across the junctions of the SQUID varies from zero to twice the single junction value as the flux linking the loop is changed by $\phi_o$, the flux quantum. For $I_{rf} >> \phi_o/L_s$, the phases of the junction oscillations are determined mainly by the external rf current.

Because of the flux quantization condition, however, there is a dc circulating current in the SQUID loop of magnitude $\phi_o/L_s$. This circulating current causes a difference in the effective bias current of the two junctions.

From Eq. (1) we see that a small change $(dI_B)$ in the bias current produces a change $(d\delta)$ in the phase of the supercurrent oscillations given by $d\delta = dI_B/J\sin\delta$. Thus the difference in the phases $\Delta^{-1}$ of the supercurrent oscillations of the two junctions is approximately given by $$\Delta^{-1} \equiv \delta_1 - \delta_2 \simeq \frac{2\phi_o/L_s}{J \sin \delta}. \qquad (2)$$

Thus, if $J \sin \delta$ is large compared to $\phi_o/L_s$ (and also the noise currents in the junctions), the rf voltages across the two junctions essentially add in phase. This is the essential condition for coherence of the array and is accomplished according to the present invention by making the feedback loop primarily inductive, i.e., $\sin \delta$ is made as close to unity as is practicable. In this case, all the even harmonics in the voltage produced across the SQUID's cancel out; they are out of phase because the bias currents flow in opposite directions in the two junctions, as above discussed.

The amplitude of the rf circulating current in the feedback loop, assuming that all the junctions in the array oscillate in phase, can be shown to be $$I_{rf} = \frac{NV_o}{\sqrt{(\omega L)^2 + (R + NR_J)^2}}; \qquad (3)$$

where $R_J$ is the normal resistance of one junction, N is the number of junctions in the array, $V_o$ is the amplitude of the voltage oscillations for a single junction for $I_{rf}=0$, and L and R are the inductance and resistance of the feedback loop respectively. In this case, the phase difference $(\delta)$ between the supercurrent oscillations and the circulating current is given by $$\tan \delta = \omega L/(R + NR_J). \qquad (4)$$

Equations (2), (3) and (4) give the range over which phase locking in the novel array of the present invention occurs.

According to the well known RSJ model, the amplitude of the voltage oscillations is $2V_o$ for frequencies $f=2eV/h>>(I_cR_J)2e/h$, where $I_c$ is the critical current of one junction and V is the dc voltage thereacross. On the other hand, for frequencies above the characteristic frequency $f_c=2eI_cR_J/h$, this amplitude is $I_cR_J$. Also, half the step height (J) according to this model is given by $J=I_{rf}/(2(1+v^2)^{\frac{1}{2}})$, where $v=V/I_cR_J$. Below a frequency $\omega_L$ given by $$\omega_L=(R+NR_J)/L, \qquad (5)$$

where $\delta=\pi/4$, the locking parameter ($\Delta$) decreases rapidly—roughly as $\omega^2$—permitting the noise currents in the junctions and the flux quantization condition to destroy the in-phase coherence. Thus $\omega_L$ provides an estimate of the low frequency cutoff of the self-phase locking of the present invention.

Between $f_L$ and the characteristic frequency $f_c$, the locking parameter ($\Delta$) remains about constant. Beyond $f_c$, the step height (J) decreases as $\omega^{-2}$. When this becomes comparable to $\phi_o/L_s$ and the noise current in the junctions, in-phase coherence is again destroyed. In the discussion above, it has been implicitly assumed that the length of the array is smaller than a quarter of a wavelength at all frequencies. This condition is necessary for continuous tunability over the operating range.

By way of completeness, it is to be noted that the novel array 10 of the present invention can be fabricated by well known electron beam lithography techniques, and reference may be had to Lukens et al, *Future Trends in Superconductive Electronics*, A. I. P. Conf. Proc. No. 44, pp. 298-311, A. I. P. New York, 1978, incorporated herein by reference, for the details thereof.

We wish it to be clearly understood that although In microbridges were utilized in the preferred embodiment, other hysteresis-free Josephson junctions such as point contacts, SLUG's, resistively shunted tunnel junctions and other weak links may be utilized as well.

We also wish it to be clearly understood that the parameter values specified herein are exemplary rather than limitative and that we do not wish to be bound by the exact details of construction herein shown and described.

What is claimed is:

1. Apparatus suitable for use as a tunable, wideband microwave oscillator comprising:

a line array of a plurality of hysteresis-free Josephson junctions selectively spaced along a longitudinal axis;

a source of biasing current;

a plurality of interlocking superconducting loops of an inductance $L_s$, having superconducting biasing leads extending substantially transverse to said longitudinal axis and connected to said source of biasing current, said loops being shunted across adjacent pairs of said hysteresis-free Josephson junctions to produce equal and opposite dc bias voltages across said adjacent pairs of said hysteresis-free Josephson junctions to provide a common frequency of operation; and a feedback loop, having an inductance L, shunted around the ends of said array to produce a circulating rf current through said array to provide phase coherence.

2. Apparatus as recited in claim 1, wherein said spacing of said hysteresis-free Josephson junctions is selected to avoid intrinsic quasiparticle interactions.

3. Apparatus as recited in claim 1, wherein said Josephson junctions each have a normal resistance $R_J$, and wherein said inductance (L) of said feedback loop is selected so that its impedance will be approximately equal to the sum of said normal resistances ($R_J$) of said plurality of Josephson junctions at the lowest frequency of interest.

4. Apparatus as recited in claim 3, wherein said feedback loop further includes a resistance R.

5. Apparatus as recited in claims 2 or 4, wherein said inductive impedance (resulting from loop inductance $L_s$) of said superconducting loops is greater than said resistance ($R_J$) of said Josephson junctions.

6. Apparatus as recited in claims 2 or 4, wherein said Josephson junctions are thin film planar In microbridges.

7. A method for providing a tunable wideband microwave oscillator, comprising the steps of:

arranging a pluraliy of hysteresis-free Josephson oscillators in a line array at a spacing selected to avoid intrinsic quasiparticle interactions;

inserting said array into a gap in a central conductor;

shunting adjacent pairs of said hysteresis-free Josephson oscillators with interlocking superconducting loops having extending biasing leads connected to a source of biasing current to produce equal and opposite dc voltages across said adjacent pairs; and shunting the end junctions of said array of Josephson oscillators by a principally inductive superconducting loop to produce a circulating rf current through said array to provide phase coherence between individual Josephson oscillators.

* * * * *